(12) United States Patent
Maleev (10) Patent No.: US 11,664,283 B2
(45) Date of Patent: May 30, 2023

(54) RAMAN SENSOR FOR SUPERCRITICAL FLUIDS METROLOGY

(71) Applicant: TOKYO ELECTRON LIMITED, Tokyo (JP)

(72) Inventor: Ivan Maleev, Pleasanton, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 40 days.

(21) Appl. No.: 17/445,570

(22) Filed: Aug. 20, 2021

(65) Prior Publication Data

US 2023/0055423 A1 Feb. 23, 2023

(51) Int. Cl.
*H01L 21/66* (2006.01)
*G01N 21/65* (2006.01)
(Continued)

(52) U.S. Cl.
CPC ............... *H01L 22/26* (2013.01); *B08B 3/08* (2013.01); *B08B 7/0021* (2013.01); *B08B 7/04* (2013.01);
(Continued)

(58) Field of Classification Search
CPC ...... B08B 13/00; B08B 7/0021; G01N 21/65; H01L 22/26; H01L 21/02041; H01L 21/02043; H01L 21/02052; H01L 21/02054; H01L 21/02057; H01L 21/02101; H01L 21/67017; H01L 21/67023; H01L 21/67028;
(Continued)

(56) References Cited

U.S. PATENT DOCUMENTS 7,102,132 B2 9/2006 Ludviksson
7,604,010 B2 10/2009 Hasebe et al.
(Continued)

FOREIGN PATENT DOCUMENTS

CN 112577941 A 3/2021

OTHER PUBLICATIONS

International Search Report and Written Opinion dated Nov. 4, 2022 in PCT/US2022/037464 filed on Jul. 18, 2022, 9 pages.
(Continued)

*Primary Examiner* — David G Cormier
(74) *Attorney, Agent, or Firm* — Oblon, McClelland, Maier & Neustadt, L.L.P.

(57) ABSTRACT

An apparatus includes a measurement chamber configured to retain one or more sample substances. The apparatus includes an entrance window mounted on a side of the measurement chamber. The apparatus includes a light source configured to generate an incident light beam. The apparatus includes a Raman sensor configured to collect inelastically scattered light from the chamber, and measure an intensity of a Raman peak of a first substance from the one or more sample substances based on the collected inelastically scattered light. The apparatus further includes a processor configured to (i) calculate a concentration of the first substance based on at least the measured intensity of the Raman peak of the first substance, (ii) determine the end point of a wafer cleaning process based on a calculated concentration of the first substance, and (iii) terminate the wafer cleaning process based on the determined end point.

20 Claims, 10 Drawing Sheets

(51) Int. Cl.
*G01N 21/41* (2006.01)
*B08B 3/08* (2006.01)
*B08B 7/00* (2006.01)
*B08B 7/04* (2006.01)
*H01L 21/02* (2006.01)
*B08B 13/00* (2006.01)

(52) U.S. Cl.
CPC ......... *B08B 13/00* (2013.01); *G01N 21/4133* (2013.01); *G01N 21/65* (2013.01); *H01L 21/02057* (2013.01); *G01N 2201/129* (2013.01)

(58) Field of Classification Search
CPC ........... H01L 21/67034; H01L 21/6704; H01L 21/67051; H01L 21/67057
See application file for complete search history.

(56) References Cited

U.S. PATENT DOCUMENTS

| | | | |
|---|---|---|---|
| 10,837,902 | B2 | 11/2020 | Maleev et al. |
| 2006/0107973 | A1 | 5/2006 | Leung |
| 2012/0152898 | A1* | 6/2012 | Cho .................. H01L 21/02104 156/345.24 |

OTHER PUBLICATIONS

Kachi et al., "Raman spectral shifts of $Co_2$ as measure of $CO_2$-philicity of solutes in supercritical carbon dioxide", The Journal of Supercritical Fluids, 2007, vol. 40, pp. 20-26.

* cited by examiner

RAMAN SENSOR FOR SUPERCRITICAL FLUIDS METROLOGY

BACKGROUND

Wafer cleaning solutions are a critical part of semiconductor industry. The purpose of cleaning includes removing residual by-products of other semiconductor process steps, such as etching. One of ordinary skill in the art may also desire to remove surface particles or unwanted films. Typically, cleaning processes use one or multiple solvents such as SC-1/SC-2 liquid (RCA clean), and then rinse the wafer with alcohol/isopropanol. At the end of the process, it is also critical to remove from the wafer surface any traces of remaining isopropanol (IPA). Otherwise, evaporating IPA may exert capillary forces on tool structures on the wafer surface and cause their collapse. Methods developed include the use of agents that reduce surface tension and the ability of a cleaning agent to "wet" the surface. Ideally, one of ordinary skill in the art would prefer an agent with a surface tension approaching zero and the capability to turn into gas without going through phase transition. An example of the latter is supercritical carbon dioxide ($CO_2$).

The development of semiconductor industry wafer cleaning solutions led to the utilization of supercritical fluids to remove cleaning agents from wafer surfaces. A wafer is placed in a chamber where normally gaseous $CO_2$ is subjected to a pressure and a temperature above a critical point, and turns into a supercritical fluid state ($scCO_2$). Most substances turn into gas when heated above a certain temperature. Likewise, gases turn into liquid and/or solid when compressed beyond a certain pressure. However, when some materials such as carbon dioxide are subjected to pressure and temperature above a so-called critical point, they turn into so-called supercritical fluid, with properties remarkably different from either liquid or gas. Most importantly, supercritical fluid can undergo gradual transition to either gas or liquid without sharp phase transition. $ScCO_2$ also has very low viscosity, and therefore, exerts minimal capillary forces on wafer structures.

ScCO2 dissolves and displaces a cleaning agent (e.g. isopropanol (IPA)). The solution of IPA in $scCO_2$ may be removed via an exhaust port. At the end of the cleaning cycle, it is preferred that only pure $scCO_2$ remains. Then the pressure in the chamber is gradually reduced below supercritical point until $CO_2$ gradually turns into gas and leaves the wafer dry and, preferably, free from cleaning byproducts.

An end point method and apparatus are needed for real-time in-situ tracking of the presence of the cleaning agent residues in a cleaning chamber exhaust.

SUMMARY

According to some embodiments, an apparatus for in-situ cleaning end point detection includes a measurement chamber configured to retain one or more sample substances. The apparatus further includes an entrance window mounted on a side of the measurement chamber. The apparatus further includes a light source configured to generate an incident light beam, the incident light beam being directed through the entrance window into the chamber, the incident light beam being inelastically scattered inside the chamber by the one or more sample substances. The apparatus further includes a Raman sensor configured to collect the inelastically scattered light from the chamber, and measure an intensity of a Raman peak of a first substance from the one or more sample substances based on the collected inelastically scattered light. The apparatus further includes a processor configured to (i) calculate a concentration of the first substance from the one or more sample substances based on at least the measured intensity of the Raman peak of the first substance, (ii) determine the end point of a wafer cleaning process based on a calculated concentration of the first substance, and (iii) terminate the wafer cleaning process based on the determined end point According to some embodiments, a method for in-situ cleaning end point detection includes directing, by a light source during a wafer cleaning process, an incident light beam through an entrance window of a measurement chamber, the measurement chamber retaining one or more sample substances, the incident light beam being inelastically scattered inside the chamber by the one or more sample substances. The method further includes collecting, by a Raman sensor, the inelastically scattered light from the chamber. The method further includes measuring, by the Raman sensor, an intensity of a Raman peak of a first substance from the one or more sample substances based on the collected inelastically scattered light. The method further includes calculating, by a processor, a concentration of the first substance based on an at least the measured intensity of the Raman peak of the first substance. The method further includes determining, by the processor, an end point of the wafer cleaning process based on a calculated concentration of the first substance. The method further includes terminating, by the processor, the wafer cleaning process based on the determined end point.

The foregoing paragraphs have been provided by way of general introduction, and are not intended to limit the scope of the following claims. The described embodiment, together with further advantages, will be best understood by reference to the following detailed description taken in conjunction with the accompanying drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Existing sensors allow tracking the state of $CO_2$ fluid. However, these sensors have limited sensitivity to the concentration of a contaminant (e.g., IPA) in supercritical $CO_2$ or similar fluids. Without an end point IPA tracking sensor, a cleaning tool must either continue to pump $CO_2$ through the chamber until sufficient margin is established, or risk damage to the wafer if the cleaning process stops before IPA is removed completely. Furthermore, if the cleaning process is stopped too early, the wafer may subject to a subsequent cleaning process, thereby decreasing wafer processing throughput.

Embodiments disclosed herein are directed to a method and a cleaning apparatus, designed to track the amplitude of contaminant-specific Raman scattering peaks and back-calculate the concentration of the contaminant (e.g., IPA) in the supercritical cleaning chamber exhaust. Particularly, there may be a continued flow of fluids through the cleaning chamber, from entrance to exhaust. ScCo2 may gradually dissolve IPA over a period of time (e.g., 1-2 minutes), and a solution of the IPA in the scCO2 leaves the chamber through the exhaust. A metrology module may be placed at the exhaust location so that all outgoing IPA and scCO2 passes through the metrology module. The cleaning apparatus may include a sensor that provides inline remote sensing capability via a single optical window without disturbing the flow of $scCO_2$.

According to some embodiments, the cleaning apparatus includes a remote-sensing Raman sensor that tracks contaminants inside high-pressure and temperature chamber via an optical window. The cleaning apparatus may further include a high-stability laser and beam shaping optics. The Raman sensor may include two or more photosensitive detectors, each with an individual narrow-band filter, at least one for tracking amplitude of specific Raman peak of the contaminant of interest, and at least one for tracking background.

Figure 1:
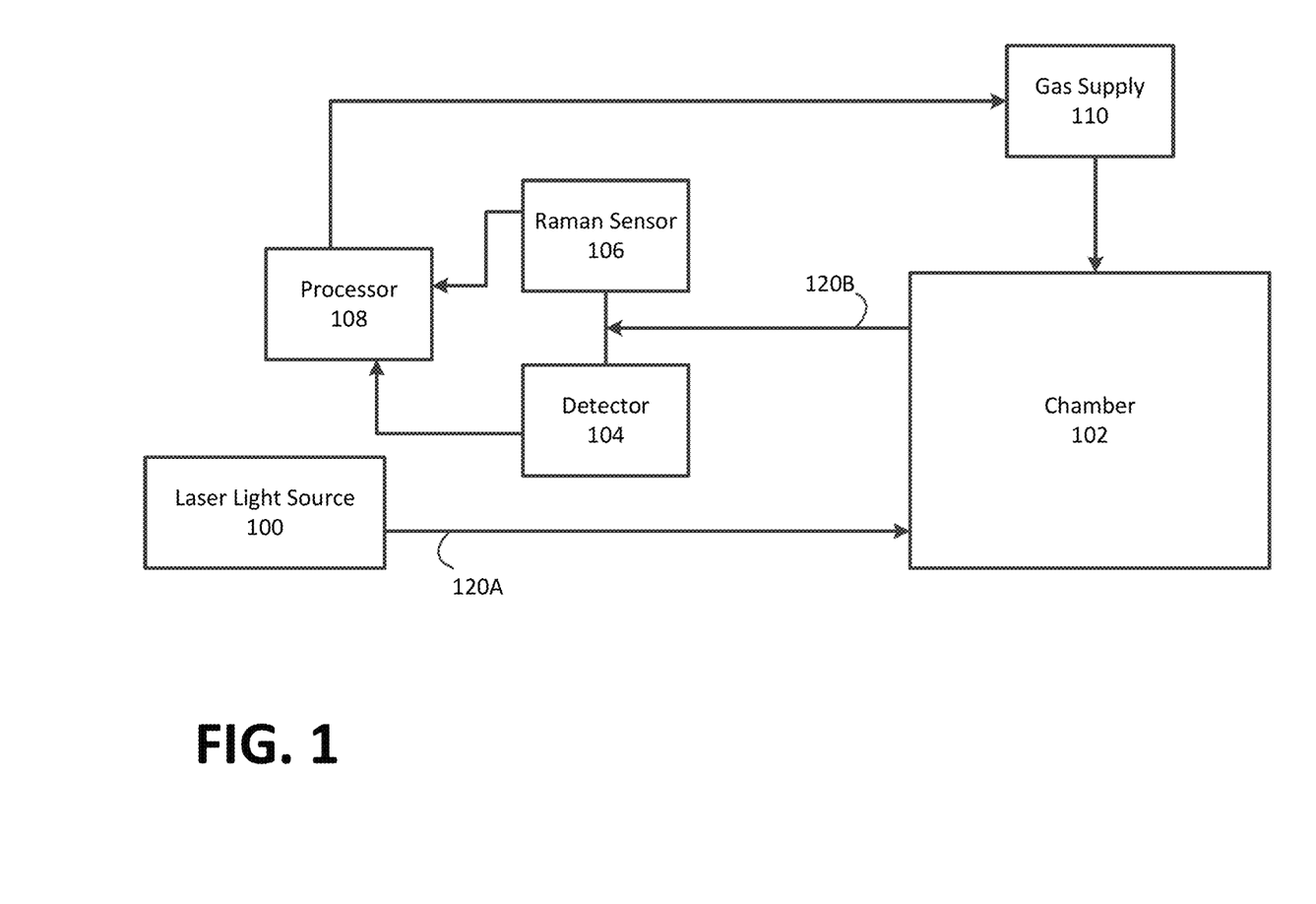
FIG. 1 illustrates an exemplary block diagram of a cleaning apparatus in accordance with some embodiments.

FIG. 1 illustrates an embodiment of the cleaning apparatus. The cleaning apparatus may include a laser light source 100 that directs a light 120A towards a chamber 102. The chamber 102 may include one or more wafer for performing a cleaning process. The light 120A may enter the chamber 102 via an entrance window. The cleaning apparatus may further include a sensor 104 and a Raman sensor 106 that collects light 120B that exits the chamber 102. The light may be inelastically scattered light. The light 120B may exit the chamber 102 via the entrance window. The cleaning apparatus may further include a processor 108 that receives information from the sensors 104 and 106, and controls a flow of gas from the gas supply 110 to the chamber 102 based on the information received from the sensors 104 and 106. For example, based on the information received from the Raman sensor 106, the processor 108 may detect an end point of a wafer cleaning process and control the gas supply 110 to terminate the end point of the wafer cleaning process. The sensor 104 may be an optical sensor that may determine a phase of super critical fluid (SCF) from refractive index measurements. An example of a SCF refractive index sensor is provided in U.S. Pat. No. 10,837,902, the entire contents of which are incorporated herein by reference. Based on data received from the sensors 104 and 106, the processor 108 may provide feedback to the cleaning process control system and help insure that the cleaning process is completed when the concentration of residues falls below desired threshold while minimizing cleaning cycle time and $CO_2$ consumption for reduction in cycle cost and environmental benefits.

In some embodiments the Raman sensor may include two photodiodes, each with a narrow band filter. A central wavelength of one of the filters may be tuned to match the wavelength of one of the Raman peaks of the contaminant in question such as IPA. The central wavelength of another one of the filters may be tuned to a wavelength away from the Raman peaks of interest (e.g., IPA and $CO_2$), and also away from other wavelengths where one of ordinary skill in the art would not expect an optical signal with the selected light source. An example excitation wavelength includes 785 nm, with the notch filter blocking 785 nm light in the collection path. In that example the first filter could be tuned to transmit for example wavelengths in the range of 835-843 nm around 839 nm IPA Raman peak, and the second filter could be tuned to transmit for example wavelengths in 820-835 nm range (see FIG. 6) for the background light with that particular light source. In other embodiments the Raman sensor could include three photodiodes, each with a narrow band filter (see FIG. 2). In that example one filter could be tuned to IPA Raman peak wavelength at 839 nm, second filter could be tuned to collect the background over 820-835 nm range, and third filter could be tuned to collect one of CO2 Raman peak at 873 nm According to some embodiments, the cleaning apparatus includes an optical design that sends illumination light through the window of a high-pressure/high-temperature chamber, and collects the light scattered by the test substance through the same window. The scattered light is then separated from the illumination light substantially using a dichroic mirror. Then the scattered light is further optically processed by filtering residual illumination light with a notch filter. Then filtered light is analyzed using 2 or more photosensitive detectors, at least one detector to measure the background, and at least one detector to measure intensity of the Raman peak of the contaminant of interest.

Figure 2:
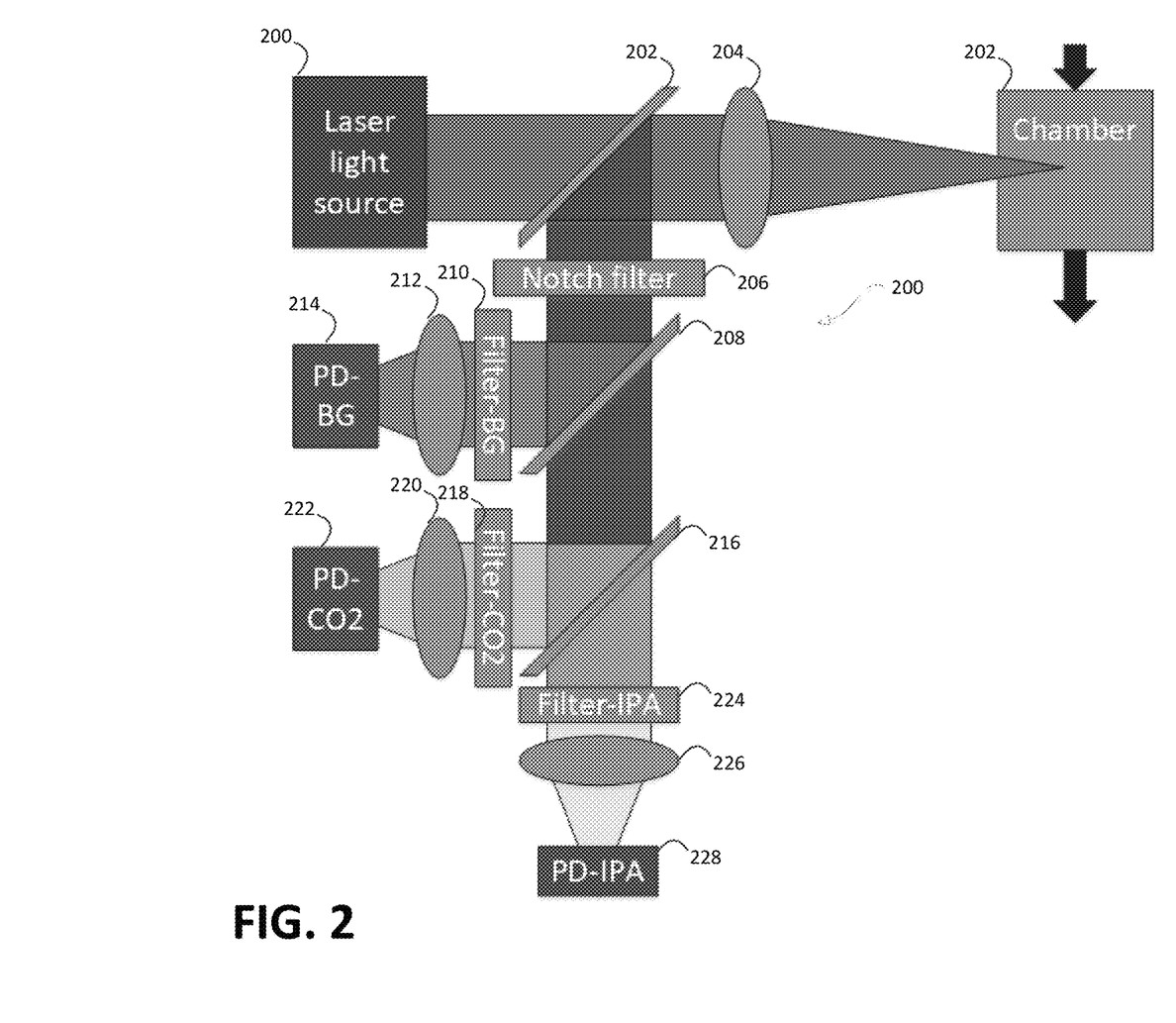
FIG. 2 illustrates an exemplary Raman sensor in accordance with some embodiments.

FIG. 2 illustrates an embodiment of a Raman sensor. As illustrated in FIG. 2, the illumination light is focused into a test volume using an optical lens 204. This optical lens 204 may be used to collect scattered Raman light, and separate the scatter Raman light from the illumination light using dichroic mirror 202 that transmit excitation wavelength light and reflects light at a Raman peak wavelength. The collected scattered Raman light is further filtered by a notch filter 206. As understood by one of ordinary skill in the art, the Raman light corresponds to inelastically scattered light (e.g., scattered photons have a different wavelength than the non-scattered photons) After being filtered by the notch filter 206, the collected scattered light may be passed through an additional band-pass filter "Filter-BG" 310 to select the background wavelength(s) of interest. The background light may be focused by an optical lens 312 on a background detector "PD-BG" 314, which can be a photodiode or similar photosensitive detector.

After being filtered by the notch filter 206, an additional dichroic mirror 208 separates background light at wavelengths other than Raman peaks for the substance(s) of interest (e.g., IPA and CO2). For example, after passing through the dichroic mirror 208, the collected light may be passed through an additional band-pass filter "Filter-CO$_2$" 218 to select the wavelength corresponding to the Raman peak of CO$_2$. The CO$_2$ light may be focused by an optical lens 220 on a CO$_2$ detector "PD-CO$_2$" 222, which can be a photodiode or similar photosensitive detector.

Furthermore, the Raman sensor may further include dichroic mirror 216 that separates the CO$_2$ light from the IPA light. For example, after passing through the dichroic mirror 216, the collected light may be passed through an additional band-pass filter "Filter-IPA" 224 to select the wavelength corresponding to the Raman peak of IPA. The IPA light may be focused by an optical lens 226 on the photodiode "PD-IPA" 228, which can be a photodiode or similar photosensitive detector. In some embodiments, instead of using a dichroic mirror, one of ordinary skill in the art may use a non-wavelength sensitive beam-splitter. In some embodiments, the photodiodes PD-CO$_2$ 214 and PD-IPA 228 register the Raman peaks for CO$_2$ and IPA, respectively. The peaks for CO$_2$ can occur at 1286 cm$^{-1}$, and the shift from the illumination wavelength for IPA can occur at 819 cm$^{-1}$.

Figure 3:
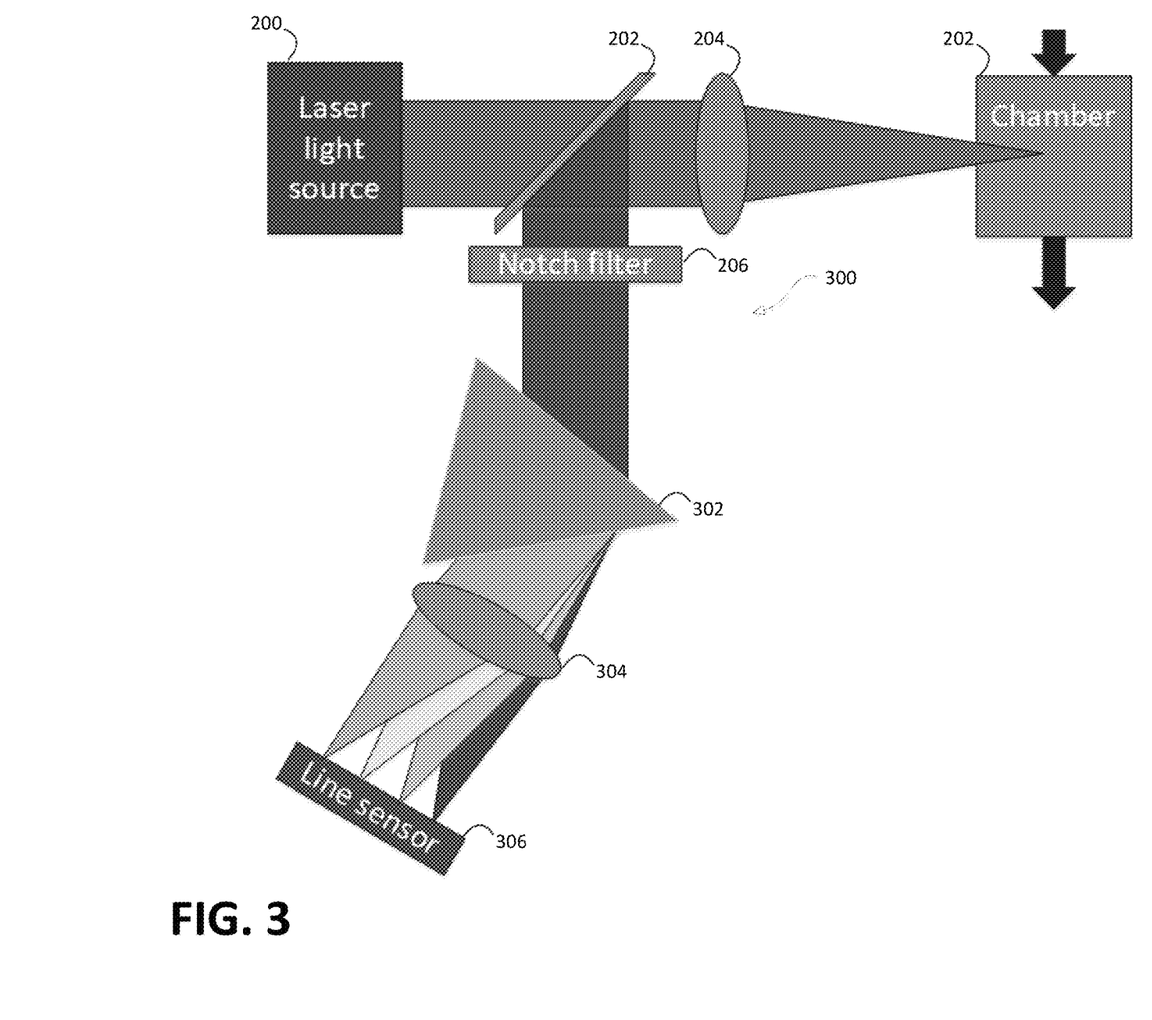
FIG. 3 illustrates an exemplary Raman sensor in accordance with some embodiments.

FIG. 3 illustrates another embodiment of a Raman sensor that includes a prism-based spectrometer arrangement to register the Raman peaks of the substances of interest (e.g. CO$_2$ and IPA). In this regard, light passing through the initial notch filter 206 may go through a dispersive prism 302 that separates different wavelengths. The prism 302 may include focusing optics that focuses light on a line sensor 306. The line sensor may be a multi-pixel detector that operates as a high-light-throughput spectrometer, which includes Raman peaks for the molecules of interest such as IPA and CO$_2$.

Figure 4:
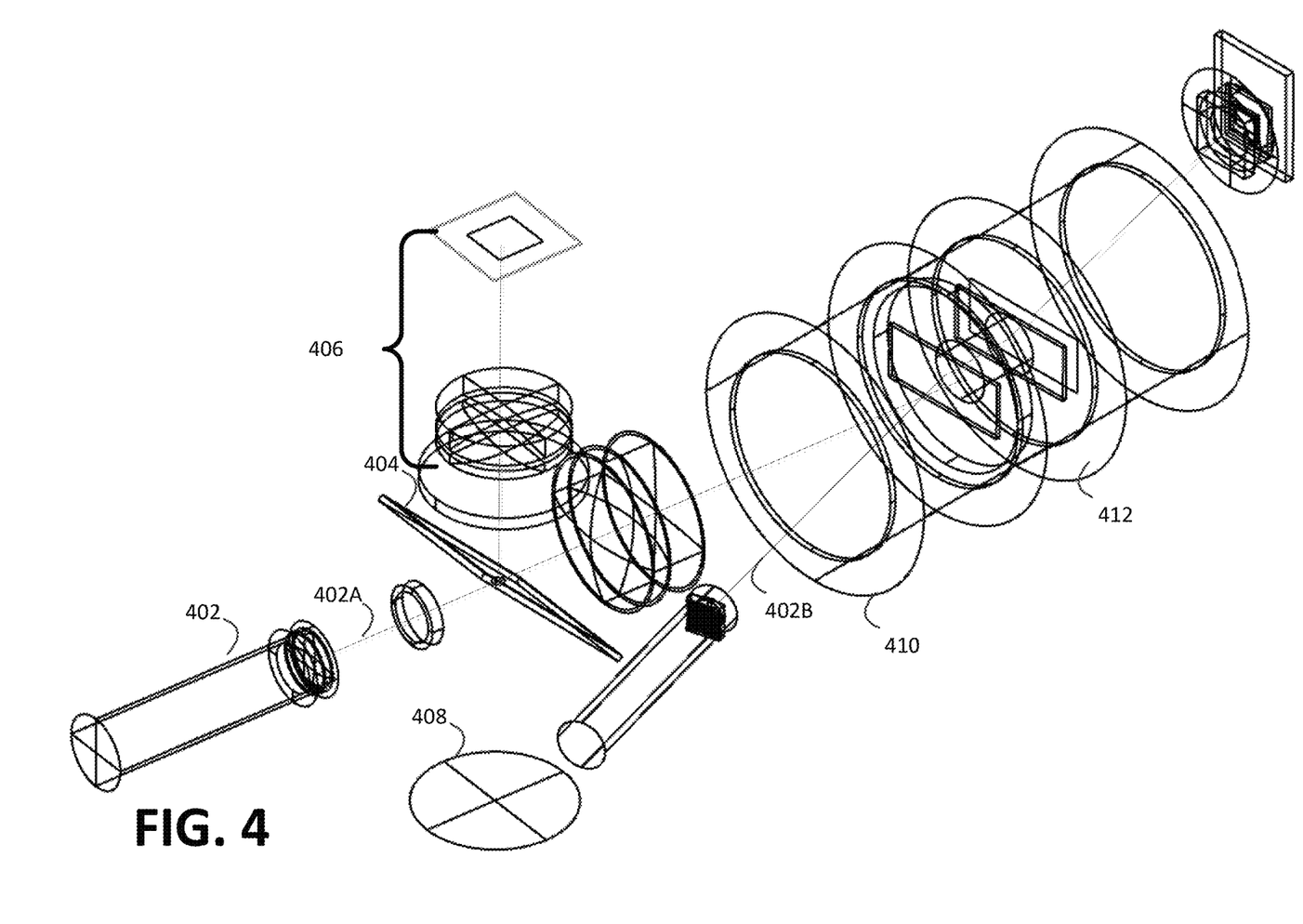
FIG. 4 illustrates an exemplary cleaning apparatus in accordance with some embodiments.

FIG. 4 illustrates an example structure of a cleaning apparatus that includes a light source 402 that direct lights 402A through an entrance window 410 of a measurement chamber. The light may come in contact with a substance on wafer to generate inelastically scattered light 402B. The inelastically scattered light may leave the measurement chamber via the entrance window 410 and may be collected by a Raman sensor 406 and an optical detector 408. The measurement chamber may further include a refractive index sensor detector 412. Both the directed light 402A and inelastically scattered light may leave the measurement chamber via an exit window.

Figure 5:
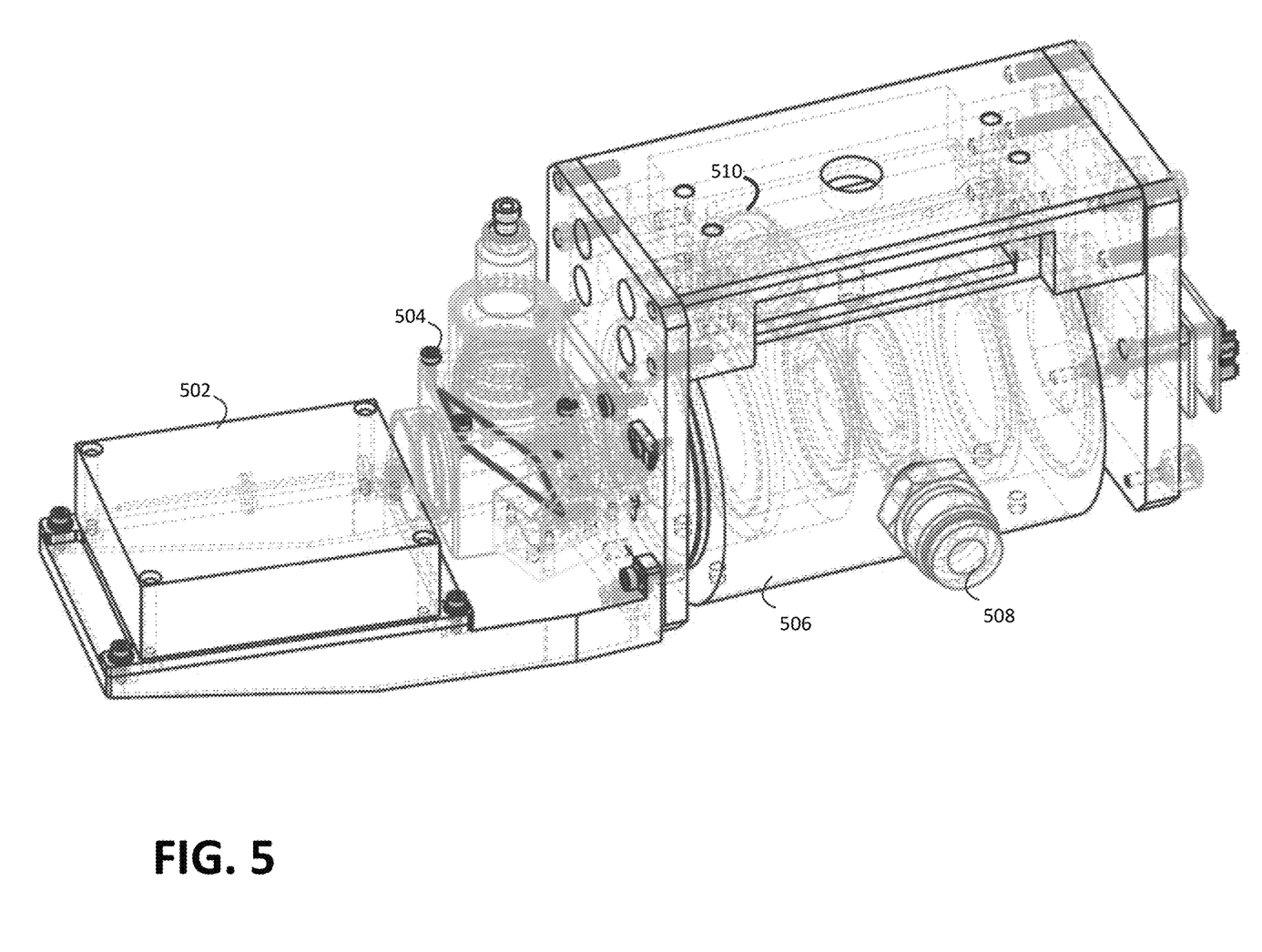
FIG. 5 illustrates an exemplary mechanical structure of the cleaning apparatus in accordance with some embodiments.

FIG. 5 illustrates an example mechanical structure of the cleaning apparatus illustrated in FIG. 4. The mechanical structure of the cleaning apparatus may include a light source 502 that directs light through an optical configuration 504 before entering a measurement chamber 506. The optical configuration 504 may include a dichroic mirror and optical lens. The measurement chamber 506 may include ports 508 and 510. One of these ports may be connected to a gas supply line, while the other port is connected to another line and functions as an exhaust port.

Figure 6:
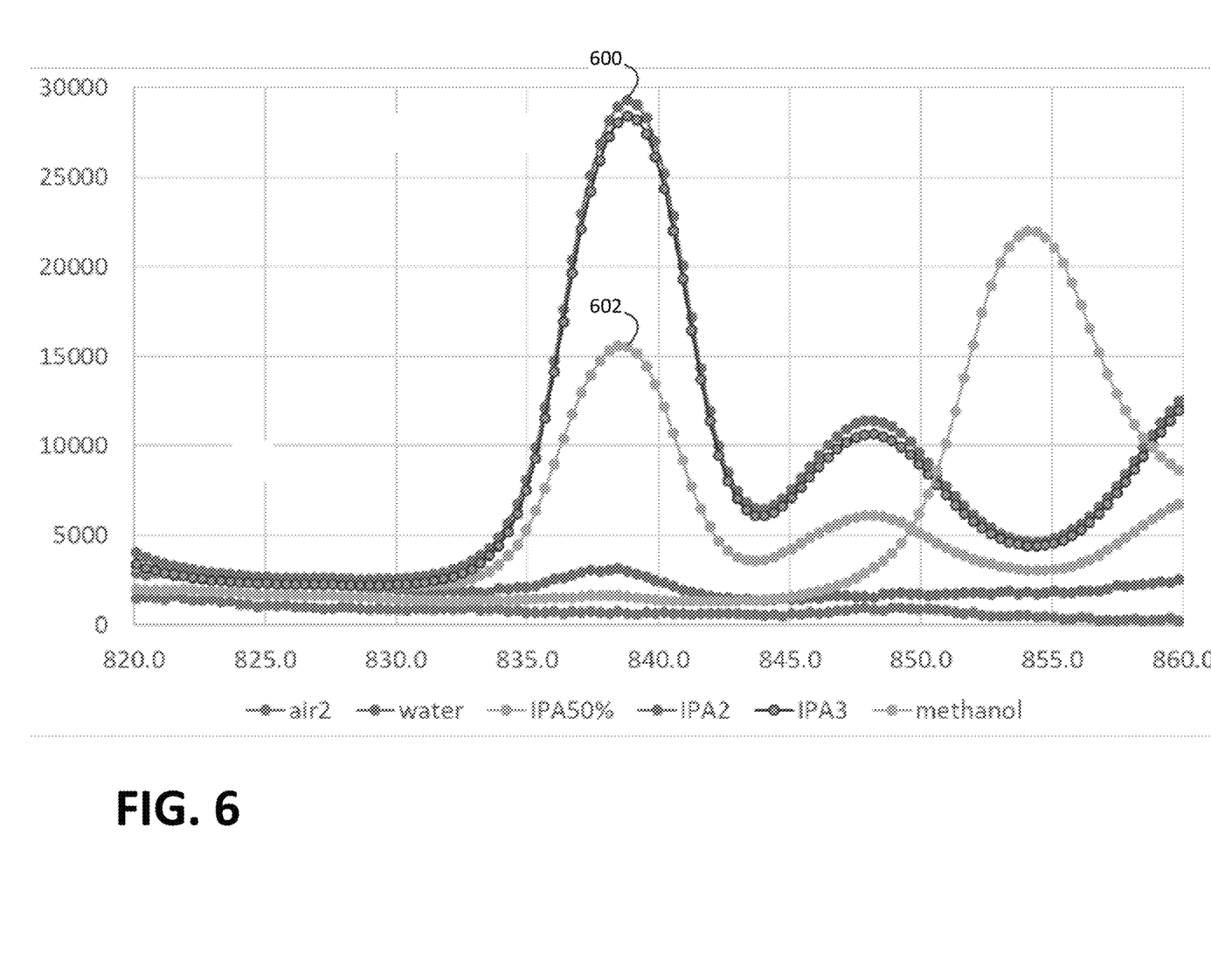
FIG. 6 illustrates an exemplary graph of a Raman peak of IPA in accordance with some embodiments.

FIG. 6 is an example chart that illustrates how an intensity of the Raman peak of IPA varies based on the concentration of IPA. The x-axis of the chart illustrates the Raman shift (cm$^{-1}$). The y-axis of the chart shows arbitrary units (a.u.) showing spectrometer signal intensity. FIG. 6 illustrates an example intensity of the Raman peak of IPA at a first concentration (600), and an example intensity of the Raman peak of IPA at a second concentration (602) that is 50% of the first concentration. As illustrated in FIG. 6, when the concentration of IPA is reduced by 50%, the intensity of the IPA Raman peak is approximately reduced by 50%.

In some embodiments, the determination of the end point of the wafer cleaning process may be determined based on the intensity of the Raman peak of IPA. In other embodiments, the determination of the end point of the wafer cleaning process may be determined based on a relative peak strength of the IPA Raman peak. The relative peak strength of the IPA Raman peak may be determined using the following parameters:

A: Intensity of Raman peak of contaminant of interest (e.g., IPA)
B: Intensity of Raman peak of solvent/cleaning agent (e.g. SCF CO$_2$)
C: Intensity of background light Next, the Raman peak intensities may be calculated relative to background:

$$A'=A-C \qquad \text{Eq. 1:}$$

$$B'=B-C \qquad \text{Eq. 2:}$$

The calculated parameter A' may be the relative peak intensity of IPA, and B' may be the relative peak intensity of CO$_2$. Next, the relative peak strength of IPA may be determined as follows:

$$D=A'-B', \qquad \text{Eq. 3:}$$

where D is the relative peak strength of IPA.

In another example, the relative peak strength of IPA may be determined as follows:

$$D=A'/B', \qquad \text{Eq. 4:}$$

where D is the relative peak strength of IPA.

The parameters A, B, and C may be provided from the Raman sensor to the processor 108 (FIG. 1) for performing the calculations in Eqs. 1-4.

Figure 7:
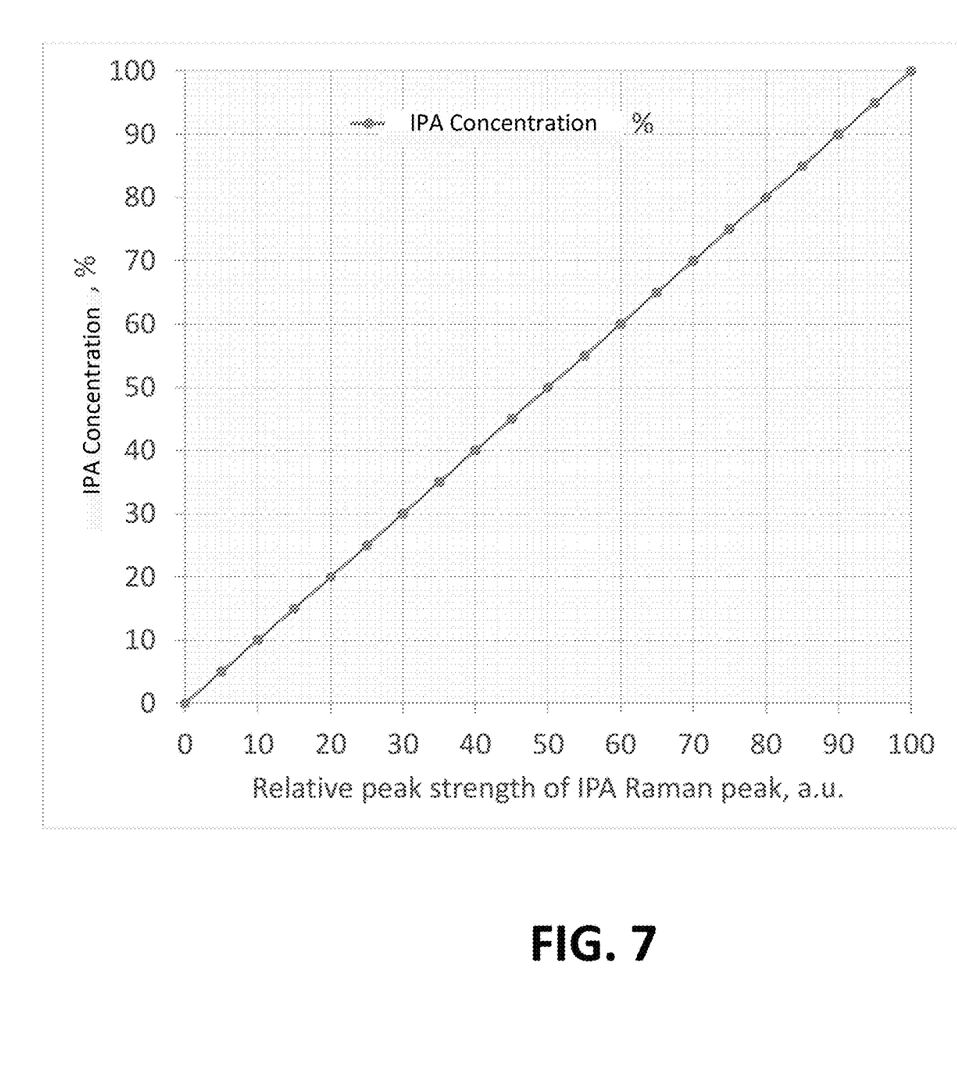
FIG. 7 illustrates an exemplary graph of the relationship between IPA concentration and the Raman peak of IPA in accordance with some embodiments.

FIG. 7 illustrates an example chart of the relative peak strength of the IPA Raman peak vs. the concentration of IPA in the measurement chamber. As illustrated in FIG. 7, the relative peak strength of the IPA Raman peak has a linear correlation with the concentration of IPA in the measurement chamber. Accordingly, upon determination of the relative peak strength of the IPA Raman peak, one of ordinary skill in the art can determine the concentration of IPA in the measurement chamber. In some embodiments, when the relative peak strength of the IPA Raman peak is below a predetermined threshold, the end point of the wafer cleaning process may be determined, and the wafer cleaning process may be terminated.

Figure 8:
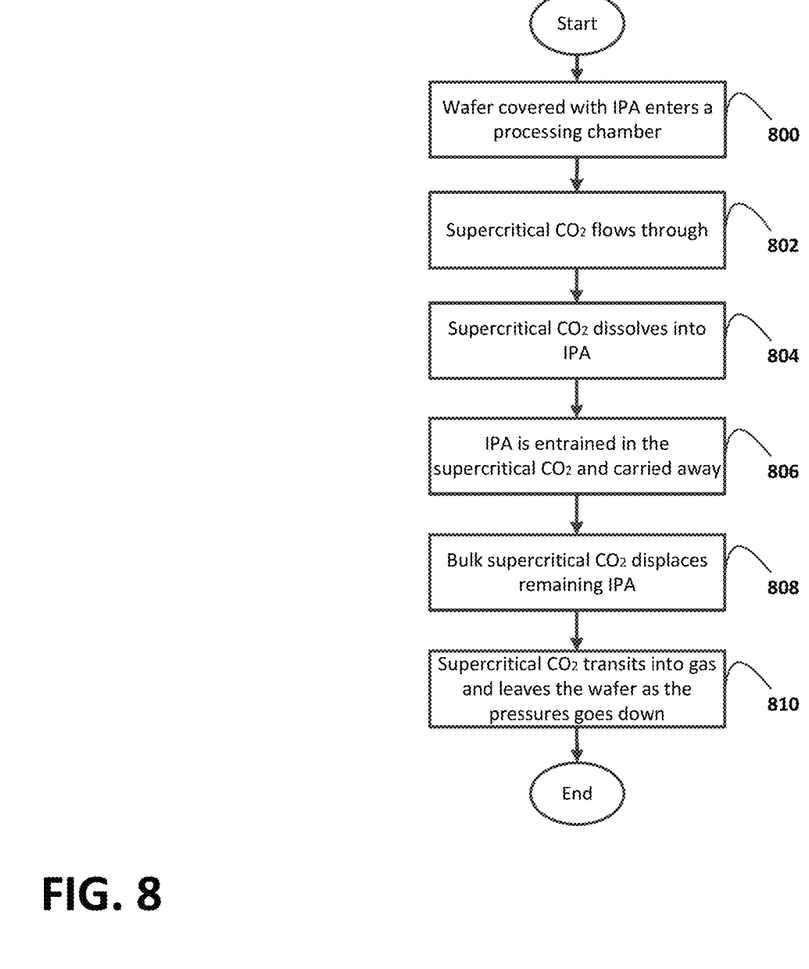
FIG. 8 illustrates an exemplary flow chart of a wafer cleaning process in accordance with some embodiments.

FIG. 8 illustrates an embodiment of a wafer clean cycle based on supercritical $CO_2$ fluid, in accordance with some embodiments of the present disclosure. The wafer clean cycle process may start at 800, where supercritical $CO_2$ fluid is maintained in a supply pipe and a wafer covered with IPA enters a processing chamber. In some embodiments, the wafer can have a plurality of micro-structures. The micro-structures can be openings with a width and a height. The IPA can be trapped in the openings from a prior processing step, such as an IPA dry process. The process proceeds from step 800 to step 802, where the supercritical $CO_2$ fluid is introduced to the processing chamber via an input valve and the supercritical $CO_2$ fluid flows through top surface of the wafer. At step 804, where as more and more supercritical $CO_2$ fluid is introduced into the processing chamber, supercritical $CO_2$ fluid dissolves into IPA that is trapped in the openings. At step 806, as the wafer cleaning process continues, the IPA is entrained in the supercritical $CO_2$ fluid and carried away. At step 808, bulk supercritical $CO_2$ fluid displaces remaining IPA as the processing time goes on. At step 810, the input valve is closed while the exit valve is still on, and the pressure of the processing chamber goes down. The supercritical $CO_2$ fluid transits into gas and leaves the wafer as the pressure goes down. The process illustrated in FIG. 8 may be terminated after step 810.

Figure 9:
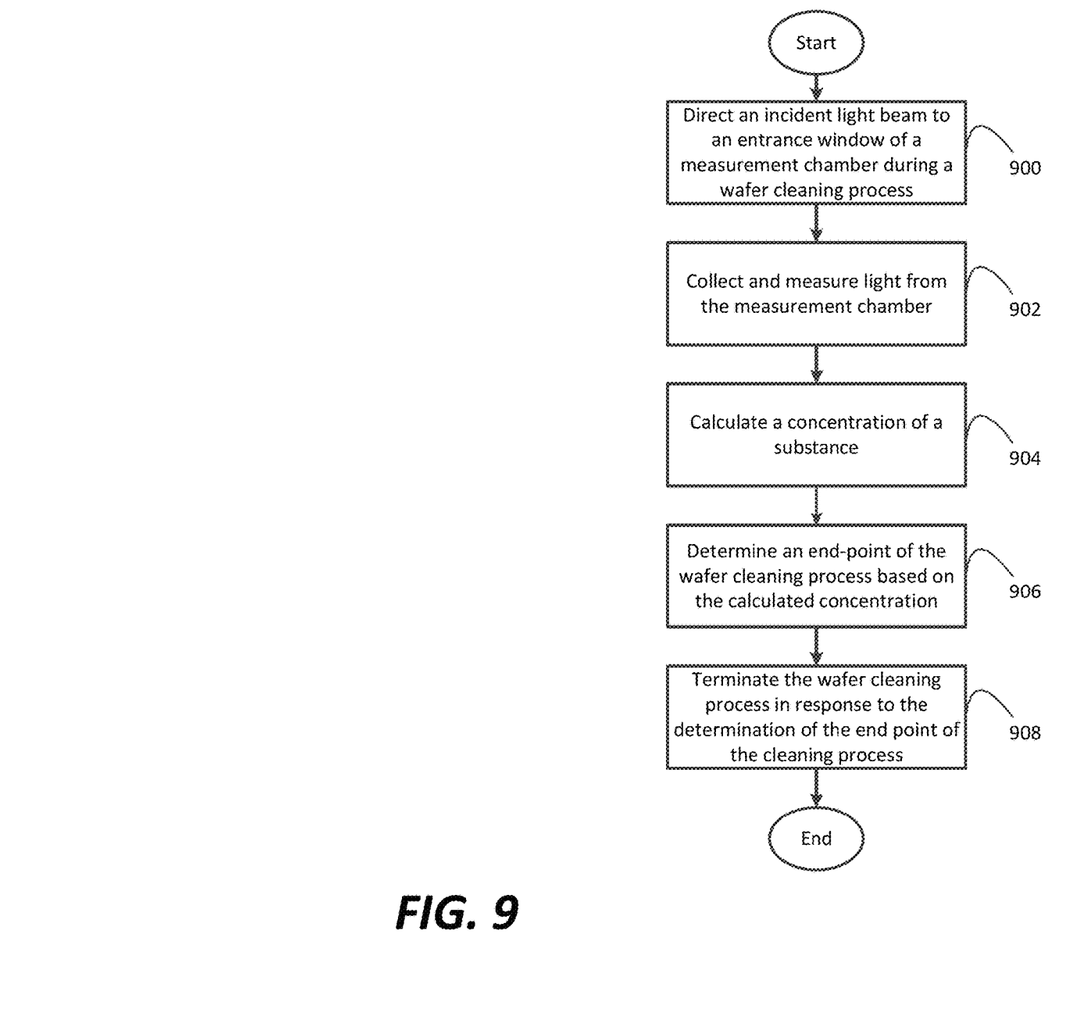
FIG. 9 illustrates an exemplary flow chart of an end point detection of the wafer cleaning process in accordance with some embodiments.

FIG. 9 illustrates an embodiment of an end point detection for a wafer cleaning process. For example, the process illustrated in FIG. 9 may be performed at any time during the process illustrated in FIG. 8, where the process illustrated in FIG. 8 may be terminated at any time based on the process illustrated in FIG. 9. In some embodiments, the end-point detection process illustrated in FIG. 9 may be run at periodic intervals (e.g., 10 ms to 1 sec) The process may start at step 900, where an incident light beam is directed to an entrance window of a measurement chamber during a wafer cleaning process. When the light beam enters the measurement chamber, the light beam becomes inelastically scattered by one or more sample substances included in the measurement chamber (e.g., IPA and $CO_2$). The process proceeds to step 902, where light from the measurement chamber is collected and measured. The light may be collected via the same entrance window through which the light enters the measurement chamber. The inelastically scattered light may be collected by a Raman sensor such as Raman sensor 200 (FIG. 2) or Raman sensor 300 (FIG. 3). For example, the Raman sensor collects the inelastically scattered light from the measurement chamber and performs spectral analysis of the collected light to measure an intensity of a Raman peak of the one or more substances included in the measurement chamber. The Raman sensor may output the parameters A (e.g., intensity of Raman peak of IPA), B (e.g., intensity of Raman peak of $CO_2$), and parameter C (e.g., intensity of background light) discussed above.

The process may proceed to step 904 where a concentration of a substance is calculated. The concentration may be calculated by the processor 108 (FIG. 1). The substance may be a contaminant of interest such as IPA. In some embodiments, the concentration of the IPA is determined based on the measured intensity of the Raman peak of IPA. In other embodiments, the calculated concentration is based on a relative peak strength of the IPA Raman peak determined in accordance with Eqs. 1-4 discussed above.

The process proceeds from step 904 to step 906 to determine an end point of the wafer cleaning process based on the calculated concentration. For example, when the calculated concentration is below a predetermined threshold, the end point of the wafer cleaning process may be determined. The process proceeds to step 908 where the wafer cleaning process is terminated in response the end point of the wafer cleaning process being determined. For example, when the end point of the wafer cleaning process is determined, the processor 108 (FIG. 1) may control a supply of $CO_2$ into the measurement chamber such that the wafer cleaning process is terminated. The process illustrated in FIG. 9 may terminate after step 908.

In some embodiments, the processor 108 (FIG. 1) may be a standalone processor such as a microcontroller that is configured to receive data from one or more sensors and execute computer code to process the received data and control a process performed on a wafer in a measurement chamber. In other embodiments, the processor 108 may be a computer system operating as a workstation terminal. For example, FIG. 10 shows a computer system (1000) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs). The instructions can be executed on various types of computers or components thereof, including, for example, personal computers, tablet computers, servers, and the like.

Figure 10:
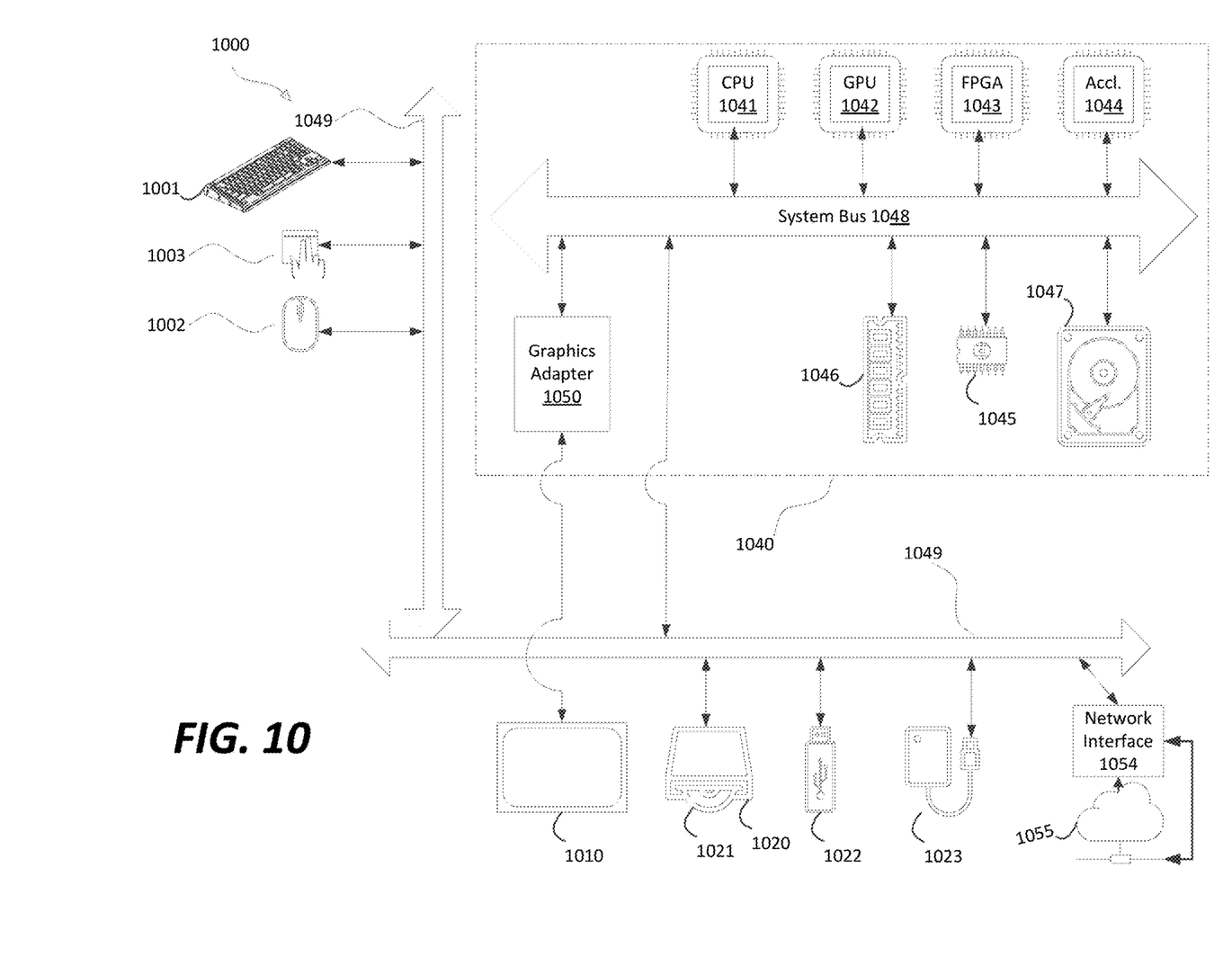
FIG. 10 illustrates an exemplary diagram of a processor in accordance with some embodiments.

The components shown in FIG. 10 for computer system (1000) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (1000).

Computer system (1000) may include certain human interface input devices. Such a human interface input device may be responsive to input by one or more human users through, for example, tactile input (such as: keystrokes, swipes). Input human interface devices may include one or more of: keyboard (1001), mouse (1002), trackpad (1003), and touch screen (1010).

Computer system (1000) may also include certain human interface output devices. Such human interface output devices may include visual output devices (such as screens (1010) to include CRT screens, LCD screens, plasma screens, OLED screens, each with or without touch-screen input capability, each with or without tactile feedback capability—some of which may be capable to output two dimensional visual output or more than three dimensional output through means such as stereographic output.

Computer system (1000) can also include human accessible storage devices and their associated media such as optical media including CD/DVD ROM/RW (1020) with CD/DVD or the like media (1021), thumb-drive (1022), removable hard drive or solid state drive (1023), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (1000) can also include an interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like. Certain networks commonly require external network interface adapters that attached to certain general purpose data ports or peripheral buses (1049) (such as, for example USB ports of the computer system (1000)); others are commonly integrated into the core of the computer system (1000) by attachment to a system bus as described below (for example Ethernet interface into a PC computer system or cellular network interface into a smartphone computer system). Using any of these networks, computer system (1000) can communicate with other entities. Such communication can be uni-directional, receive only, uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (1040) of the computer system (1000). The core (1040) can include one or more Central Processing Units (CPU) (1041), Graphics Processing Units (GPU) (1042), specialized programmable processing units in the form of Field Programmable Gate Areas (FPGA) (1043), hardware accelerators for certain tasks (1044), and so forth. These devices, along with Read-only memory (ROM) (1045), Random-access memory (1046), internal mass storage such as internal non-user accessible hard drives, SSDs, and the like (1047), may be connected through a system bus (1048). In some computer systems, the system bus (1048) can be accessible in the form of one or more physical plugs to enable extensions by additional CPUs, GPU, and the like. The peripheral devices can be attached either directly to the core's system bus (1048), or through a peripheral bus (1049). Architectures for a peripheral bus include PCI, USB, and the like.

CPUs (1041), GPUs (1042), FPGAs (1043), and accelerators (1044) can execute certain instructions that, in combination, can make up the aforementioned computer code. That computer code can be stored in ROM (1045) or RAM (1046). Transitional data can also be stored in RAM (1046), whereas permanent data can be stored for example, in the internal mass storage (1047). Fast storage to and retrieval from any of the memory devices can be enabled through the use of cache memory, that can be closely associated with one or more CPU (1041), GPU (1042), mass storage (1047), ROM (1045), RAM (1046), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (1000), and specifically the core (1040) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (1040) that are of non-transitory nature, such as core-internal mass storage (1047) or ROM (1045). The software implementing various embodiments of the present disclosure can be stored in such devices and executed by core (1040). A computer-readable medium can include one or more memory devices or chips, according to particular needs. The software can cause the core (1040) and specifically the processors therein (including CPU, GPU, FPGA, and the like) to execute particular processes or particular parts of particular processes described herein, including defining data structures stored in RAM (1046) and modifying such data structures according to the processes defined by the software. In addition or as an alternative, the computer system can provide functionality as a result of logic hardwired or otherwise embodied in a circuit (for example: accelerator (1044)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

(1) An apparatus for in-situ cleaning end point detection, the apparatus includes a measurement chamber configured to retain one or more sample substances; an entrance window mounted on a side of the measurement chamber; a light source configured to generate an incident light beam, the incident light beam being directed through the entrance window into the chamber, the incident light beam being inelastically scattered inside the chamber by the one or more sample substances; a Raman sensor configured to collect the inelastically scattered light from the chamber, and measure an intensity of a Raman peak of a first substance from the one or more sample substances based on the collected inelastically scattered light; and a processor configured to (i) calculate a concentration of the first substance from the one or more sample substances based on at least the measured intensity of the Raman peak of the first substance, (ii) determine the end point of a wafer cleaning process based on a calculated concentration of the first substance, and (iii) terminate the wafer cleaning process based on the determined end point.

(2) The apparatus of feature (1), in which the Raman sensor is further configured to measure an intensity of a Raman peak of a second substance from the one or more sample substances and an intensity of background light.

(3) The apparatus of feature (1) or (2), in which the processor is further configured to: determine a first relative intensity of the first substance by subtraction of the intensity of the background light from the intensity of the Raman peak of the first substance, determine a second relative intensity of the second substance by subtraction of the intensity of the background light from the intensity of the Raman peak of the second substance, and determine a sample Raman peak relative intensity based on the first relative intensity and the second relative intensity.

(4) The apparatus of feature (3), in which the sample Raman peak relative intensity is a difference between the first relative intensity and the second relative intensity.

(5) The apparatus of feature (3), in which the sample Raman peak relative intensity is a ratio between the first relative intensity and the second relative intensity.

(6) The apparatus of feature (4) or (5), in which the processor is further configured to calculate the concentration of the first substance from the determined sample Raman peak relative intensity.

(7) The apparatus according to any one of features (4) to (6), in which the processor is further configured to determine the end point of the wafer cleaning process in response to a determination that the sample Raman peak relative intensity is less than or equal to a threshold.

(8) The apparatus according to any one of features (1)-(7), in which the first substance is isopropanol (IPA), and the Raman sensor includes a first photosensitive detector configured to detect a Raman peak of the IPA.

(9) The apparatus according to any one of features (2)-(8), in which the second substance is carbon dioxide, and the Raman sensor includes a second photosensitive detector configured to detect a Raman peak of the carbon dioxide.

(10) The apparatus according to any one of features (2)-(9), in which the Raman sensor includes a third photosensitive detector configured to detect the background light.

(11) The apparatus according to any one of features (1)-(10), in which the Raman sensor further includes (i) a prism that separates the inelastically scattered light from the chamber into a plurality of wavelengths and (ii) a line sensor to detect the plurality of wavelengths.

(12) The apparatus according to any one of features (1)-(11), further including a super critical fluid (SCF) refractive index sensor configured to collect the inelastically scattered light from the chamber, the SCF refractive index sensor configured to determine a phase of SCF in the measurement chamber.

(13) The apparatus according to any one of features (1)-(11), in which the one or more sample substances include carbon dioxide, and the carbon dioxide is under a supercritical state.

(14) A method for in-situ cleaning end point detection includes directing, by a light source during a wafer cleaning process, an incident light beam through an entrance window of a measurement chamber, the measurement chamber retaining one or more sample substances, the incident light beam being inelastically scattered inside the chamber by the one or more sample substances; collecting, by a Raman sensor, the inelastically scattered light from the chamber; measuring, by the Raman sensor, an intensity of a Raman peak of a first substance from the one or more sample substances based on the collected inelastically scattered light; calculating, by a processor, a concentration of the first substance based on an at least the measured intensity of the Raman peak of the first substance; determining, by the processor, an end point of the wafer cleaning process based on a calculated concentration of the first substance; and terminating, by the processor, the wafer cleaning process based on the determined end point.

(15) The method of feature (14), further including measuring, by the Raman sensor, an intensity of a Raman peak of a second substance from the one or more sample substances and an intensity of background light.

(16) The method of feature (15), further including determining, by the processor, a first relative intensity of the first substance by subtraction of the intensity of the background light from the intensity of the Raman peak of the first substance; determining, by the processor, a second relative intensity of the second substance by subtraction of the intensity of the background light from the intensity of the Raman peak of the second substance; and determining, by the processor, a sample Raman peak relative intensity based on the first relative intensity and the second relative intensity.

(17) The method of feature (16), in which the sample Raman peak relative intensity is a difference between the first relative intensity and the second relative intensity.

(18) The method of feature (16), in which the sample Raman peak relative intensity is a ratio between the first relative intensity and the second relative intensity.

(19) The method of any one of features (16)-(18), in which the calculated concentration is determined from the determined sample Raman peak relative intensity.

(20) The method of any one of features (16)-(19), in which the end point of the wafer cleaning process is determined in response to a determination that the sample Raman peak relative intensity is less than or equal to a threshold.

What is claimed is:

1. An apparatus for in-situ cleaning end point detection, the apparatus comprising:
    a measurement chamber configured to retain one or more sample substances;
    an entrance window mounted on a side of the measurement chamber;
    a light source configured to generate an incident light beam, the incident light beam being directed through the entrance window into the chamber, the incident light beam being inelastically scattered inside the chamber by the one or more sample sub stances;
    a Raman sensor configured to collect the inelastically scattered light from the chamber, and measure an intensity of a Raman peak of a first substance from the one or more sample substances based on the collected inelastically scattered light; and
    a processor configured to (i) calculate a concentration of the first substance from the one or more sample substances based on at least the measured intensity of the Raman peak of the first substance, (ii) determine the end point of a wafer cleaning process based on a calculated concentration of the first substance, and (iii) terminate the wafer cleaning process based on the determined end point.

2. The apparatus of claim 1, wherein the Raman sensor is further configured to measure an intensity of a Raman peak of a second substance from the one or more sample substances and an intensity of background light.

3. The apparatus of claim 2, wherein the processor is further configured to:
    determine a first relative intensity of the first substance by subtraction of the intensity of the background light from the intensity of the Raman peak of the first sub stance,
    determine a second relative intensity of the second substance by subtraction of the intensity of the background light from the intensity of the Raman peak of the second substance, and determine a sample Raman peak relative intensity based on the first relative intensity and the second relative intensity.

4. The apparatus of claim 3, wherein the sample Raman peak relative intensity is a difference between the first relative intensity and the second relative intensity.

5. The apparatus of claim 3, wherein the sample Raman peak relative intensity is a ratio between the first relative intensity and the second relative intensity.

6. The apparatus of claim 3, wherein the processor is further configured to calculate the concentration of the first substance from the determined sample Raman peak relative intensity.

7. The apparatus of claim 3, wherein the processor is further configured to determine the end point of the wafer cleaning process in response to a determination that the sample Raman peak relative intensity is less than or equal to a threshold.

8. The apparatus according to claim 1, wherein the first substance is isopropanol (IPA), and the Raman sensor includes a first photosensitive detector configured to detect a Raman peak of the IPA.

9. The apparatus according to claim 2, wherein the second substance is carbon dioxide, and the Raman sensor includes a second photosensitive detector configured to detect a Raman peak of the carbon dioxide.

10. The apparatus according to claim 2, wherein the Raman sensor includes a third photosensitive detector configured to detect the background light.

11. The apparatus according to claim 1, wherein the Raman sensor further includes (i) a prism that separates the inelastically scattered light from the chamber into a plurality of wavelengths and (ii) a line sensor to detect the plurality of wavelengths.

12. The apparatus according to claim 1, further comprising:
a super critical fluid (SCF) refractive index sensor configured to collect the inelastically scattered light from the chamber, the SCF refractive index sensor configured to determine a phase of SCF in the measurement chamber.

13. The apparatus of claim 1, wherein the one or more sample substances include carbon dioxide, and the carbon dioxide is under a supercritical state.

14. A method for in-situ cleaning end point detection, the method comprising:
directing, by a light source during a wafer cleaning process, an incident light beam through an entrance window of a measurement chamber, the measurement chamber retaining one or more sample substances, the incident light beam being inelastically scattered inside the chamber by the one or more sample substances;
collecting, by a Raman sensor, the inelastically scattered light from the chamber;
measuring, by the Raman sensor, an intensity of a Raman peak of a first substance from the one or more sample substances based on the collected inelastically scattered light;
calculating, by a processor, a concentration of the first substance based on an at least the measured intensity of the Raman peak of the first substance;
determining, by the processor, an end point of the wafer cleaning process based on a calculated concentration of the first substance; and
terminating, by the processor, the wafer cleaning process based on the determined end point.

15. The method of claim 14, further comprising:
measuring, by the Raman sensor, an intensity of a Raman peak of a second substance from the one or more sample substances and an intensity of background light.

16. The method of claim 15, further comprising:
determining, by the processor, a first relative intensity of the first substance by subtraction of the intensity of the background light from the intensity of the Raman peak of the first substance;
determining, by the processor, a second relative intensity of the second substance by subtraction of the intensity of the background light from the intensity of the Raman peak of the second substance; and
determining, by the processor, a sample Raman peak relative intensity based on the first relative intensity and the second relative intensity.

17. The method of claim 16, wherein the sample Raman peak relative intensity is a difference between the first relative intensity and the second relative intensity.

18. The method of claim 16, wherein the sample Raman peak relative intensity is a ratio between the first relative intensity and the second relative intensity.

19. The method of claim 16, wherein the calculated concentration is determined from the determined sample Raman peak relative intensity.

20. The method of claim 16, wherein the end point of the wafer cleaning process is determined in response to a determination that the sample Raman peak relative intensity is less than or equal to a threshold.

* * * * *